United States Patent
Guan et al.

(10) Patent No.: US 6,432,742 B1
(45) Date of Patent: Aug. 13, 2002

(54) METHODS OF FORMING DROP-IN HEAT SPREADER PLASTIC BALL GRID ARRAY (PBGA) PACKAGES

(75) Inventors: Chow Seng Guan; John Briar; Loreto Y. Cantillep, all of Singapore (SG)

(73) Assignee: St Assembly Test Services Pte Ltd., Singapore (SG)

( * ) Notice: Subject to any disclaimer, the term of this patent is extended or adjusted under 35 U.S.C. 154(b) by 105 days.

(21) Appl. No.: 09/640,546

(22) Filed: Aug. 17, 2000

(51) Int. Cl.⁷ ............................................. H01L 21/44
(52) U.S. Cl. ...................... 438/106; 438/107; 438/108; 257/706
(58) Field of Search ................................ 438/106–108, 438/122–125; 257/704, 706, 707

(56) References Cited

U.S. PATENT DOCUMENTS

| | | | |
|---|---|---|---|
| 5,949,137 A | 9/1999 | Domadia et al. | 257/712 |
| 5,977,626 A | 11/1999 | Wang et al. | 257/707 |
| 6,011,304 A | 1/2000 | Mertol | 257/706 |
| 6,246,115 B1 * | 6/2001 | Tang et al. | 257/706 |

* cited by examiner

Primary Examiner—David Nelms
Assistant Examiner—Dung Anh Le
(74) Attorney, Agent, or Firm—George O. Saile; Stephen B. Ackerman; Stephen G. Stanton

(57) ABSTRACT

A method of fabricating a die-up laminated PBGA package, including the following steps. A mold chase for a PBGA package is provided. The mold chase has an open side with and exposed bottom wall and side walls, and a bottom side. The mold chase is positioned open side up. A heat spreader is dropped into the mold chase open side. The heat spreader has a lower protruding section, and lateral peripheral flanges with gaps therebetween. The protruding section contacts a portion of the bottom wall of the mold chase and the flanges contact a portion of the exposed side walls of the mold chase to thereby secure the heat spreader within the mold chase. A substrate, having a die affixed thereto in a die down position, is fixedly placed over the mold chase. The die being positioned within the space above the protruding section of the heat spreader. A flowable molding compound is applied within the space above the heat spreader and within the space 26' below the heater spreader flanges 49, 59, completely filling these spaces to form a die-up laminated PBGA package. The flowable molding compound 30 is also flowable through the gaps.

31 Claims, 6 Drawing Sheets

METHODS OF FORMING DROP-IN HEAT SPREADER PLASTIC BALL GRID ARRAY (PBGA) PACKAGES

BACKGROUND OF THE INVENTION

It is known that integrated circuit (IC) thermal enhancement is a requirement for advanced development in electronic packaging. The current cost effective means to enhance the thermal performance of die-up plastic ball grid array (PBGA) packages are:
  (i) to include power and ground planes in the laminated substrate; and
  (ii) to incorporate thermal vias and thermal balls below the die area in the laminated substrate If the above means are not able to lessen the die operating temperature of the PBGA packages in the required specification, cavity-down thermally enhanced ball grid array (EBGA) packages are generally adopted to meet the more stringent thermal requirements. However, the cost of the current EBGA packages is much higher than die-up laminated PBGA packages.

U.S. Pat. No. 5,977,626 to Wang et al. describes a PBGA semiconductor package having a heat spreader placed on the substrate and over the die by a pick and place apparatus. The molding compound is then formed over the die. The package is turned upside down and solder balls are implanted on the surface of the substrate.

U.S. Pat. No. 5,949,137 to Domadia et al. describes a flip chip packaging assembly having a stiffener device formed from a single stamping or punching operation to maintain a substantially planar upper and lower surface. The stiffener device includes a heat spreader positioned atop the flip chip device.

U.S. Pat. No. 6,011,304 to Mertol describes a heat spreader for a cavity down ball grid array (BGA).

SUMMARY OF THE INVENTION

Accordingly, it is an object of the present invention to provide an improved method of forming an exposed drop-in heat spreader PBGA package.

Another object of the present invention is to provide an improved method of forming an embedded drop-in heat spreader PBGA package.

Other objects will appear hereinafter.

It has now been discovered that the above and other objects of the present invention may be accomplished in the following manner. Specifically, a mold chase for a PBGA package is provided. The mold chase has an open side with and exposed bottom wall and side walls, and a bottom side. The mold chase is positioned open side up. A heat spreader is dropped into the mold chase open side. The heat spreader has a lower protruding section, and lateral peripheral flanges with gaps therebetween. The protruding section contacts a portion of the bottom wall of the mold chase and the flanges contact a portion of the exposed side walls of the mold chase to thereby secure the heat spreader within the mold chase. A flowable molding compound is applied over the heat spreader to completely fill the space above the heat spreader. The flowable molding compound also flows through the heat spreader peripheral flange gaps into the space below the heat spreader flanges, completely filling the lower space. A substrate, having a die affixed thereto in a die down position, is fixedly placed over the molding compound filled mold chase. The die being positioned within the space above the protruding section of the heat spreader. The molding compound is cured to form a die-up laminated PBGA package.

BRIEF DESCRIPTION OF THE DRAWINGS

The features and advantages of the method of the present invention will be more clearly understood from the following description taken in conjunction with the accompanying drawings in which like reference numerals designate similar or corresponding elements, regions and portions and in which.

DETAILED DESCRIPTION OF THE PREFERRED EMBODIMENT

Unless otherwise specified, all structures, layers, etc. may be formed or accomplished by conventional methods known in the prior art.

Structural Features Common to Both Embodiments of the Present Invention

The inventors have discovered that to incorporate a heat spreader in a plastic ball grid array (PBGA), the heat spreader may simply be "dropped in" the cavity-down mold chase prior to the molding process using the heat spreader loading jig. After the heat spreader sits inside the cavity-down mold chase, the substrate with a wire bonded unit/die is loaded on top of the heat spreader in a die-down orientation.

The heat spreader of both embodiments of the present invention are designed with multiple dimples that land on, or contact, the substrate surface to provide extra heat transfer paths from the die to the heat spreader and also improves moldability concerns.

To minimize the possibility of electrically shorting the bond-wires to the heat spreaders, an emboss may be designed at the heat spreader center area to create a sufficient space for accommodating the die and wire loop.

Two types (embodiments of the invention) of drop-in heat spreader PBGA packages are proposed:
  (i) exposed drop-in heat spreader PBGA package (XD-PBGA) (FIGS. 1–6); and
  (ii) embedded drop-in heat spreader PBGA package (MD-PBGA) (FIGS. 8–13).

Structure of the XD-PBGA and MD-PBGA Packages of the Present Invention

FIGS. 1–5 illustrate the formation of an exposed drop-in heat spreader package (XD-PBGA) and FIGS. 7–11 illustrate the formation of an embedded drop-in heat spreader package (MD-PBGA) of the present invention.

Figure 4:
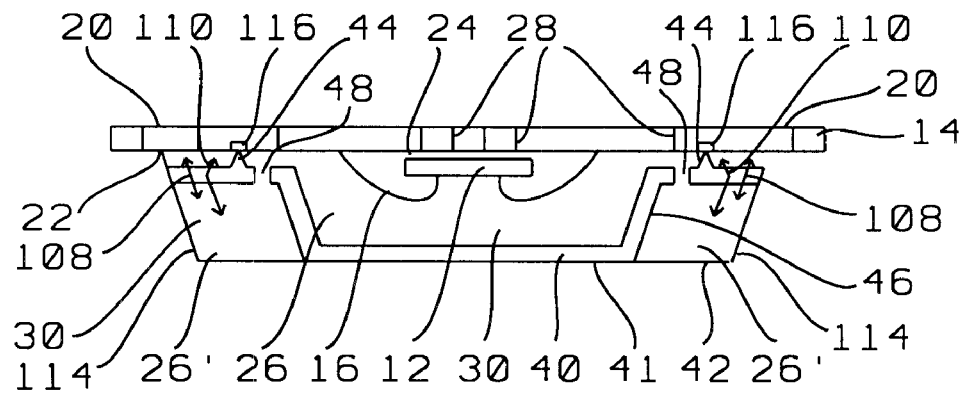
Figure 5:
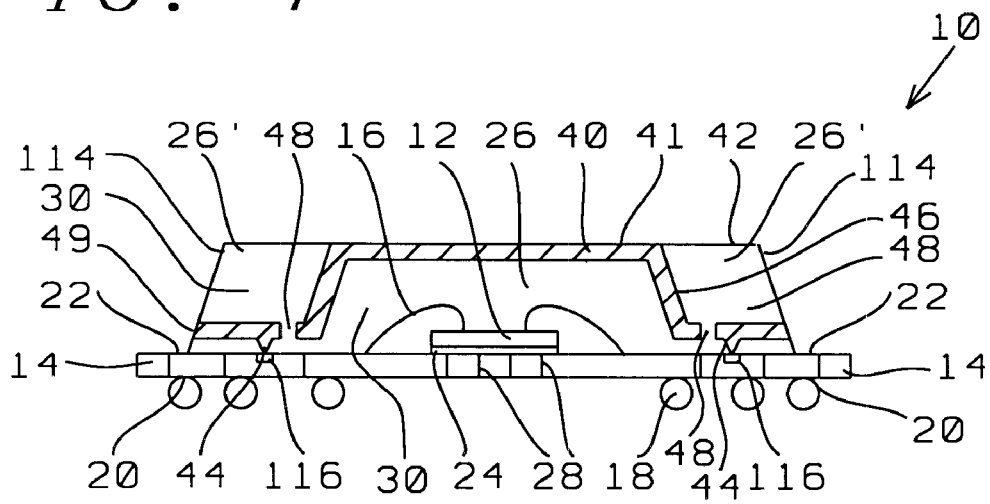
Figure 6:
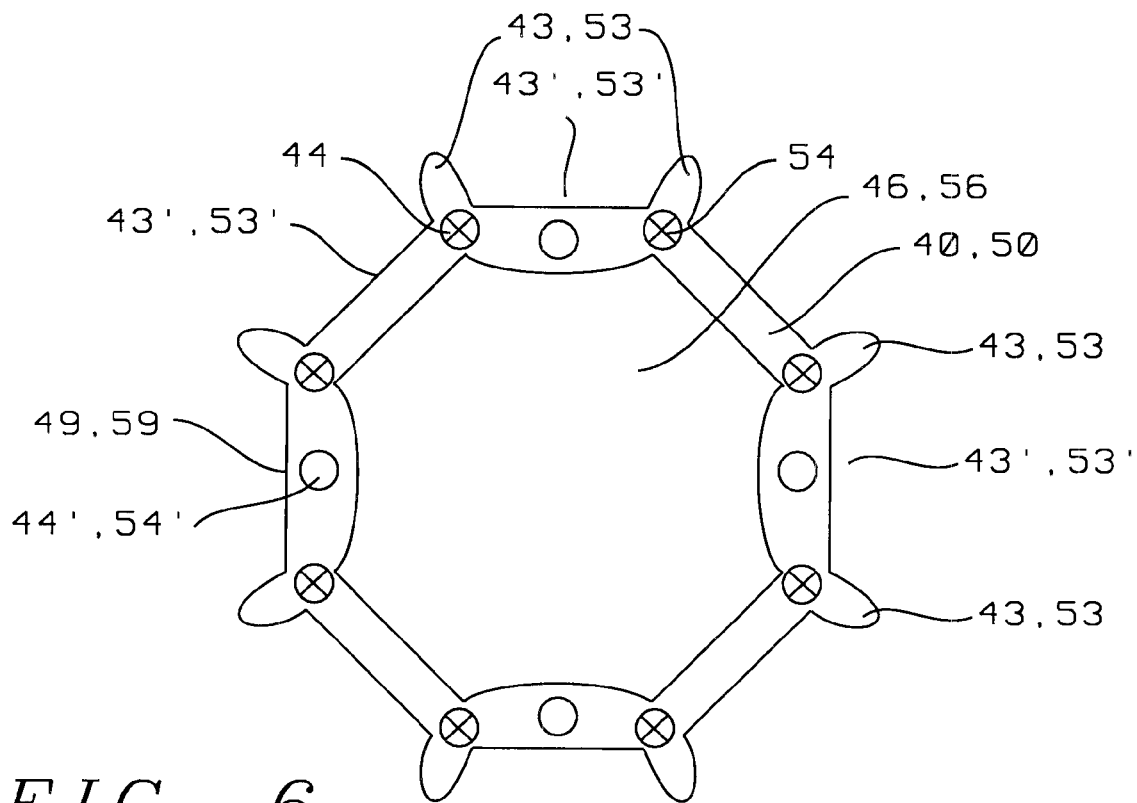
FIG. 6 schematically illustrates a plan top down view of the XD-PBGA and MD-PBGA heat spreaders.

Unless other wise indicated, the structures and like reference numerals indicate like structures in FIGS. 1–5 for the first embodiment XD-PBGA package, FIG. 6 for the top-down plan view the XD-PBGA and MD-PBGA heat spreaders, and in FIGS. 7–11 for the second embodiment MD-PBGA package.

Accordingly, FIG. 5 schematically illustrates a die-up laminated XD-PBGA package 10 made in accordance with the first embodiment of the present invention, and FIG. 5 schematically illustrates a die-up laminated MD-PBGA package 11 made in accordance with the second embodiment of the present invention. The description of the XD-PBGA package 10 and the MD-PBGA package 11 will be described in tandem as most structural features are identical except as noted.

In the XD-PBGA and MD-PBGA packages 10, 11, respectively, die (chip) 12 and substrate 14 are interconnected by, for example, bonding wires 16. Heat spreader 40, 50 may be comprised of any conducting metal such as aluminum or copper and is preferably comprised of copper.

Substrate 14 has top side 22 and bottom side 20, and includes a plurality of conductive traces (not shown) such as flexible printed circuit (PC) formed therein. Substrate 14 may be comprised of a kind of dielectric such as polyimide or phenolic resin and is preferably bismaleimidetriazine (BT).

Bonding wires 16 may be comprised of gold or copper and are preferably comprised of gold.

Die 12 is affixed to substrate 14 by die attachment (D/A) epoxy 24.

Ground/thermal vias 28 pierce substrate 14 in a predetermined pattern and serve to either provide a ground path to a ground plane (not shown) and assist in heat transfer from die 12, respectively.

Die 12 is coupled to the conductive traces in substrate 14 by conventional wire bonding techniques. One end of each of bonding wires 16 is connected to die 12 through a conductive pad array (not shown) formed therein, with the other end of each of bonding wires 16 is connected to BGA array 18 formed on bottom side 20 of substrate 14 via the conductive traces in substrate 14.

Ball grid array (BGA) 18 is preferably solder balls conventionally formed on bottom side 20 of substrate 14 and arranged in a matrix array configuration. Solder balls 18 are used for electrical coupling with die 12.

An end of each conductive trace formed within substrate 14 is typically connected to solder balls 18. Solder balls 18 are terminal of a device which permits electrical signal transfer to chip 12.

The spaces 26, 26' between substrate 14, die 12, and XD-PBGA heat spreader 40 and MD-PBGA heat spreader 50, respectively, are encapsulated by molding compound (material) 30 within mold chase 42, 52 respectively. Space 26 encompasses the area between top side 22 of substrate 14 and heat spreader 40, 50. Space 26' encompasses the area between heat spreader 40, 50 and mold chase 42, 52.

XD-PBGA heat spreader 40 and MD-PBGA heat spreader 50 each include through-holes and/or slots 48, 58, respectively, which permit better flow of molding material 30 into space 26'. Ingress of molding material 30 into through-holes 48, 58 also permit better adhesion between heat spreaders 40, 50 and molding material 30. Pressure is applied when molding compound 30 is applied to mold chase 42, 52 to assist flowing of molding compound 30 through gaps 43', 53', through through-holes 48, 58, and around dimples 44; 54, 55.

As shown in FIG. 6 (a top down view of XD-PBGA heat spreader 40 and MD-PBGA 50), to prevent heat spreaders 40, 50 from shifting and tilting during molding, peripheral flanges 49, 59 of heat spreaders 40, 50 have star-shaped tips 43, 53 with gaps 43', 53' therebetween, and are designed to secure themselves to the walls of mold chases 42, 52, respectively. In general flanges 49, 59 are distributed uniformly and symmetrically at the periphery of heat spreaders 40, 50.

Although a wider heat spreader 40, 50 area is one of the most desirable features of thermal enhancement, the clearance between flanges 49, 59, e.g. gaps 43', 53', respectively, has to be reserved to a certain extent to allow mold compound 30 to flow through that clearance and into the bottom of heat spreader 40, 50, i.e. into space 26', readily.

It is noted that any mold flash at the edges of heat spreader 40, 50 may be removed by a laser de-flash or water jet.

Heat spreaders 40, 50 preferably have eight upper dimples 44, 54 and more preferably four upper dimples 44', 54'.

Bonding wires 16 are thus electrically isolated, and protected, by molding compound 30.

Since the thickness of molding compound 30 of the PBGA packages is very thin, there is limited room for accommodating die 12 below heat spreader 40, 50. To avoid electrical shorting between bond wire 16 and heat spreader 40, 50, a maximum gap between heat spreader 40, 50 and substrate 14 is desired.

Thus a prominent design feature of XD-PBGA package 40 and the MD-PBGA 50 is the protrusion 46, 56 of heat spreader 40, 50. This protrusion 46, 56 depth of pad of heat spreader 40, 50 is also dependant upon the material thickness of heat spreader 40, 50 and the height of dimples 44, 54 contacting substrate 14. It is recommended that the low-loop height wire-bonding technique is applied to the thinner die 12 to which is attached the substrate's 14 die flag to prevent electrical shorting of bonding wire 16 to heat spreader 40, 50.

It is noted that outer surface 41 of XD-PBGA package 40 protrusion 46 is exposed to the ambient as shown in FIGS. 4 and 5.

It is also noted that because of the design and process of fabricating the XD-PBGA and MD-PBGA packages 10, 11, respectively, the marking area on substrate 14 is smaller than in many previous designs, for example.

Figure 12:
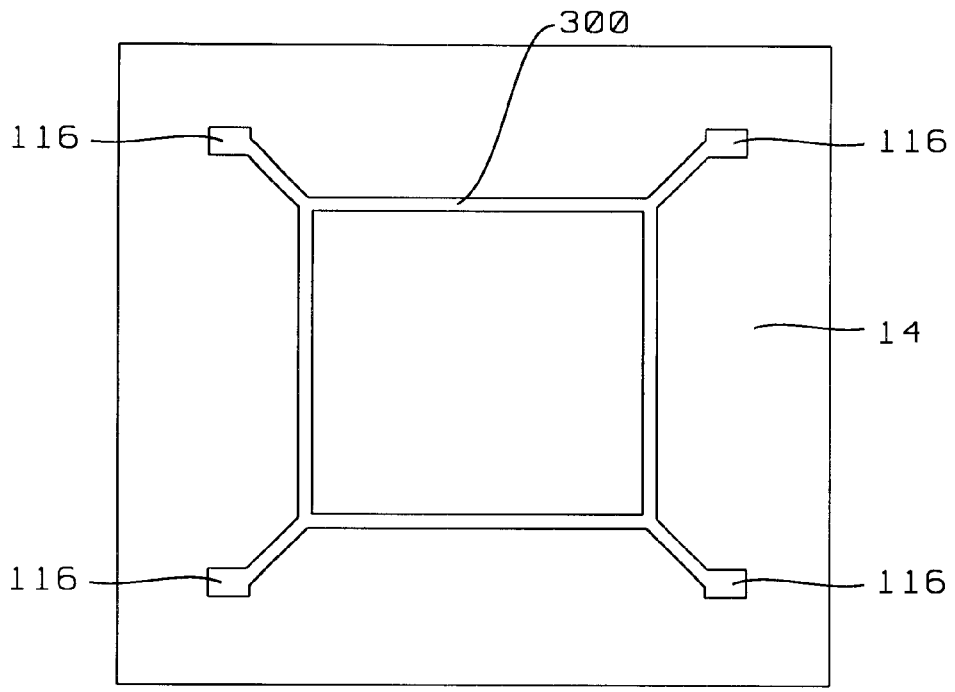
FIG. 12 schematically illustrates a plan top down view of the top side of the substrate.

FIG. 12 illustrates a four dimple pad/copper trace 116 pattern. Ground ring 300 may be extended to connect copper traces 116 so that heat spreader 40, 50 may also serve as a common ground and as a shield from electro magnetic interference (EMI) problems.

Structure Unique to MD-PBGA Heat Spreader 50

Figure 9:
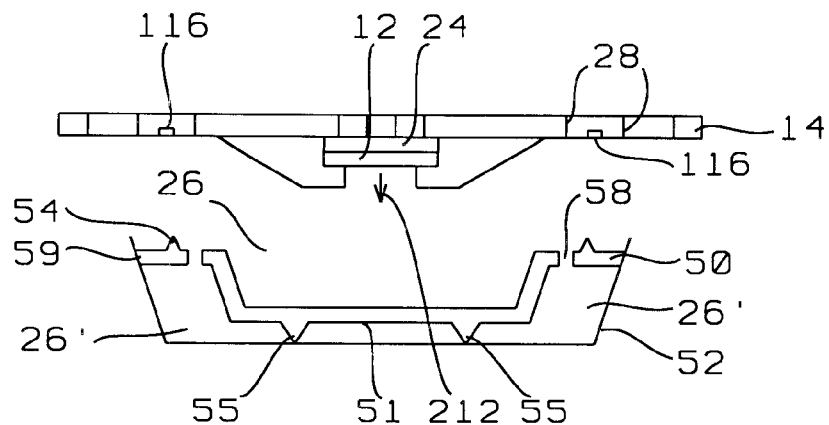
Figure 10:
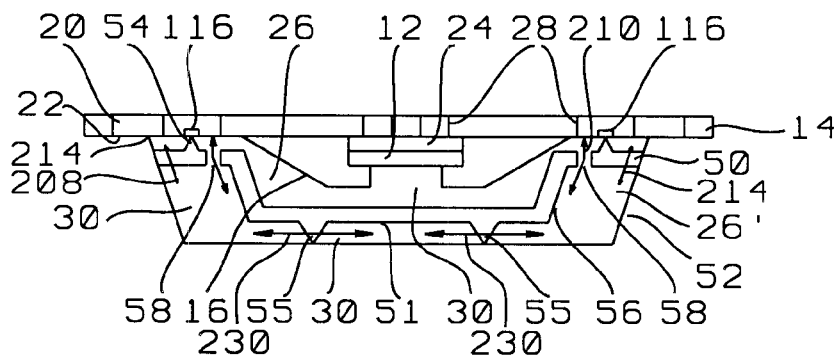
Figure 11:
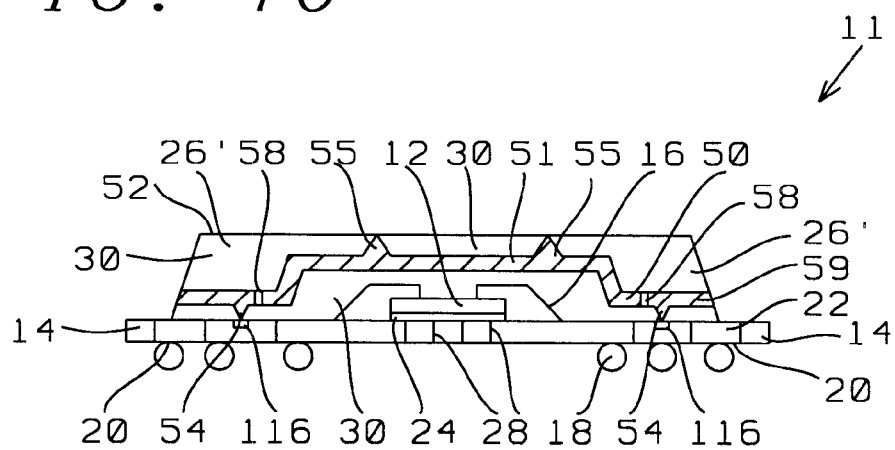

As shown in FIGS. 9–11, MD-PBGA heat spreader 50 includes outer dimples 55 on its outer surface 51. Outer dimples 55 space heat spreader 50 away from mold chase 52, permitting mold compound 30 to flow between heat spreader 50 and mold chase 52. In effect, this embeds outer surface 51 of heat spreader 50 within mold compound 30.

Design of Heat Spreader 40 Dimples 44 and Heat Spreader 50 Dimples 54,55

The design of dimples 44; 54, 55 in heat spreaders 40, 50, respectively, must be carefully considered. With a lower dimple 44; 54, 55 height, the heat path from substrate 14 to heat spreaders 40, 50, respectively, is actually reduced. It has also been found that the dimple 44; 54, 55 height cannot be lower than a critical value for moldability concerns, that is to allow molding compound 30 to flow to all areas. This critical value is about 0.2 μm.

For example, it has been found that the flow of molding compound 30 at the gaps between heat spreaders 40, 50 and substrate 14 within space 26', and the portion of space 26 between outer surface 51 of MD-PBGA heat spreader 50 and mold chase 52, would be hindered due to the inherent high viscosity of melted molding compound 30. This would result in the formation of voids or incomplete fill of molding compound 30 within space 26' and space 26 as noted.

Apart from the design constraint of the height of dimples 44; 54, 55, the contact locations of dimples 44, 54 on substrate 14 is important in XD-PBGA and MD-PBGA heat spreaders 40, 50 thermal performance. From the thermal design point of view, the contact positions of dimples 44, 54 on substrate 14 should be as close as possible to the heat source, that is the die 12 area. A four dimple design is most preferred (see below).

It should also be noted that the dimple-to-substrate contact locations should not be placed within the bond finger region due to the high density of wires within the bond finger region. Otherwise, this might lead to shorting of those wires with dimples 44, 54.

However, the exposed pad area is rather dependent on the location of dimples 44, 54. A small separation between dimples 44, 54 will not only result in a smaller exposed area for heat dissipation by convection, but there will also be less of a marking area on heat spreaders 40, 50 from the point of manufacturability concerns. Thus the landing positions of dimples 44, 54 should be compromised with the exposed window for marking consideration.

Figure 13:
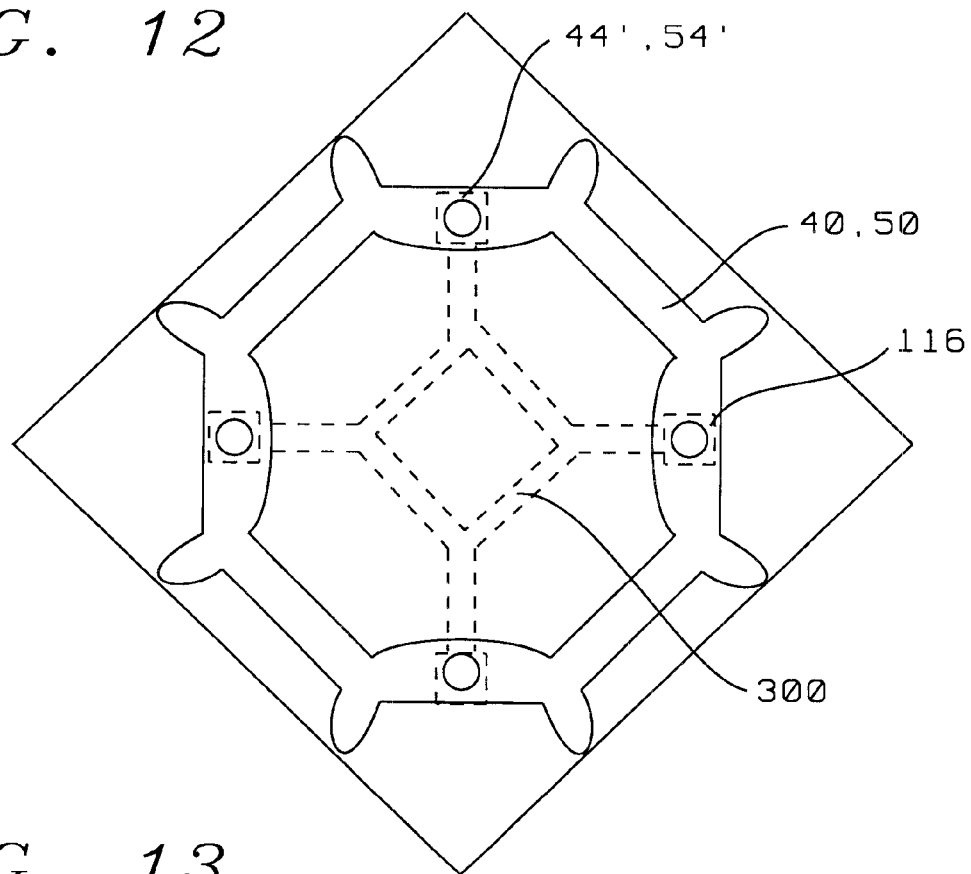
FIG. 13 schematically illustrates a plan top down of the XD-PBGA or MD-PBGA heat spreader positioned within the substrate of FIG. 14.

FIG. 13 illustrates the preferred four upper dimple 44', 54' heat spreader 40, 50 design within the four dimple pad/copper trace 116 pattern substrate 14 of FIG. 12. Each upper dimple 44', 54' contacts a respective copper trace 116 pattern.

Formation of an Exposed Drop-In Heat Spreader BGA (XD-PBGA) Package 10

FIGS. 1–5 illustrate the first embodiment of the innovative method of assembly of XD-PBGA heat spreader package 10.

Figure 1:
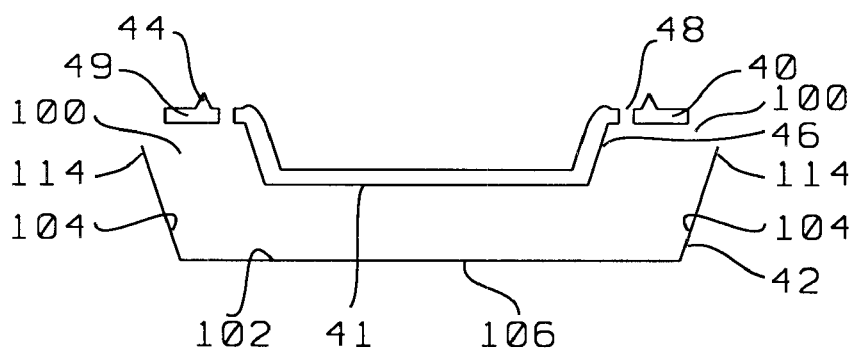
FIGS. 1–5 schematically illustrate in cross-sectional representation the first embodiment of the present invention forming an exposed drop-in heat spreader ball grip array (XD-PBGA) package.

As shown in FIG. 1, mold chase 42 for XD-PBGA package 10 has bottom side 106, and open side 100 with an exposed bottom wall 102 and side walls 104. Mold chase 42 is positioned open side 100 up.

In a key step of the invention, heat spreader 40 is dropped into the open side 100 of mold chase 42 preferably using a heat spreader 40 loading jig (not shown).

Figure 2:
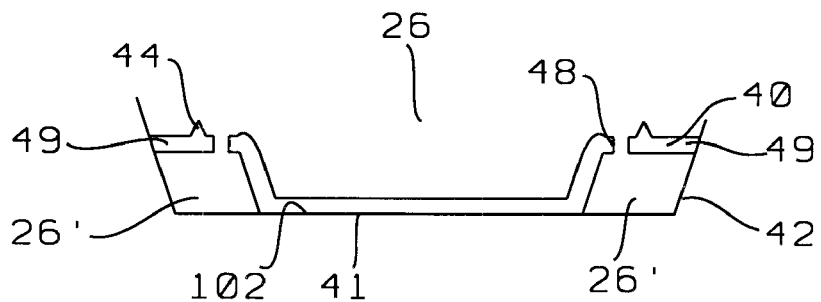

As shown in FIG. 2, after heat spreader 40 is dropped into mold chase 42, outer surface 41 of heat spreader 40 protruding section 46 contacts exposed bottom wall 102. This exposes outer surface 41 of heat spreader 40. Lateral peripheral flanges 49 contact a portion of exposed side walls 104 of mold chase 42 to secure heat spreader 40 within mold chase 42. Specifically, star-shaped tips 43 of flanges 49 (also see FIG. 6) contact exposed side walls 104 leaving gaps 43' between flanges 49 and side walls 104.

Figure 3:
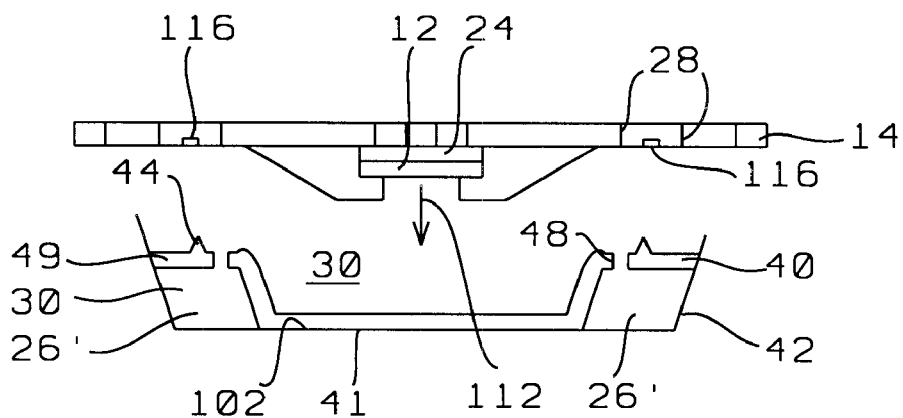

As shown in FIG. 3, substrate 14 with die 12 is positioned die down over mold chase 42. Die 12 is centered over filled space 26 formed by heat spreader protrusion 46 as illustrated by arrow 112.

As shown in FIG. 4, substrate 14 is placed into contact with mold chase 42 so that die 12 and wires 16 fit within, and are protected by, protruding section 46 of heat spreader 40.

Molding compound 30 is made flowable, by heating for example, and is applied by injecting tubes (not shown), for example, over heat spreader 40 to completely fill the space 26 between heat spreader 40 and substrate 14 with die 12, and around dimples 44. The flowable molding compound 30 also flows through gaps 43' (also see FIG. 6) as at arrow 108, and through through-holes 48 as at arrow 110, into the space 26' below heat spreader flanges 49 to completely fill lower space 26'. It is noted that no voids or gaps within molding compound 30 filled space 26' are formed.

As shown in FIG. 4 substrate 14 contacts outer ends 114 of mold chase 42 and the ends of dimples 44 at copper traces 116, and die 12 and wires 16 are embedded within flowable molding compound 30 in space 26. As necessary, solder paste may be added at the contact point between dimples 44 and copper traces 116 to further secure substrate 14 fixedly to heat spreader 40.

It is noted that flowable molding compound 30 does not need to be cured, thus providing for a faster cycling time.

As shown in FIG. 5, ball grid array 18 is then formed on bottom side 20 of substrate 14, and the structure of FIG. 5 is flipped over to form a die-up laminated exposed drop-in heat spreader ball grip array (XD-PBGA) package.

Formation of an Embedded Drop-In Heat Spreader BGA (MD-PBGA) Package 11

FIGS. 7–11 illustrate the second embodiment of the innovative method of assembly of MD-PBGA heat spreader package 11.

Figure 7:
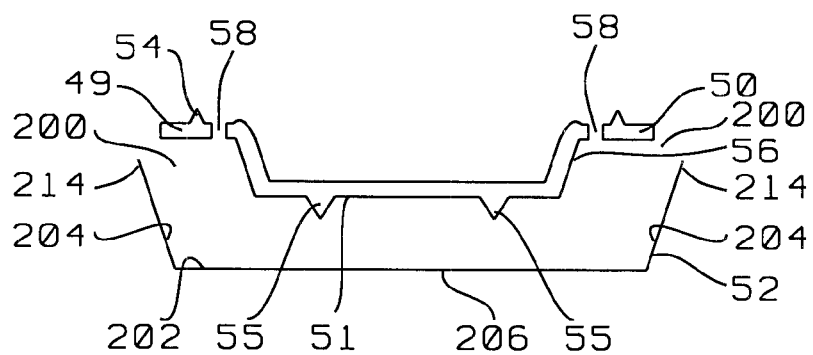
FIGS. 7–11 schematically illustrate in cross-sectional representation the second embodiment of the present invention forming an embedded drop-in heat spreader ball grip array (MD-PBGA) package.

As shown in FIG. 7, mold chase 52 for MD-PBGA package 11 has bottom side 206, and open side 200 with an exposed bottom wall 202 and side walls 204. Mold chase 52 is positioned open side 200 up.

In a key step of the invention heat spreader 50 is dropped into the open side 200 of mold chase 52 preferably using a heat spreader 50 loading jig (not shown).

Figure 8:
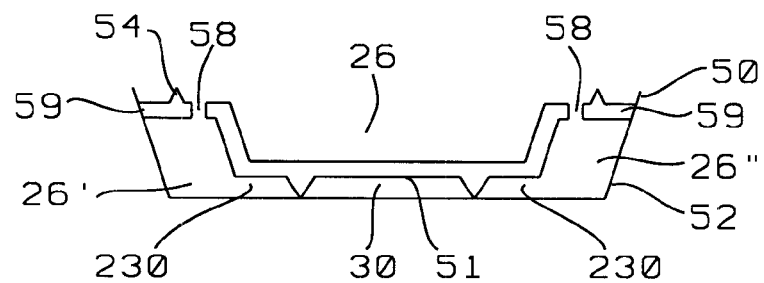

As shown in FIG. 8, after heat spreader 50 is dropped into mold chase 52, the ends of dimples 55 protruding from outer surface 51 of protruding section 56 contacts exposed bottom wall 102. This will permit flowable molding compound 30 to flow around dimples 55 and embed heat spreader 50.

Lateral peripheral flanges 59 contact a portion of exposed side walls 204 of mold chase 52 to secure heat spreader 50 within mold chase 52. Specifically, star-shaped tips 53 of flanges 59 (also see FIG. 6) contact exposed side walls 204 leaving gaps 53' between flanges 59 and side walls 204.

As shown in FIG. 9, substrate 14 with die 12 is positioned die down over mold chase 52. Die 12 is centered over filled space 26 formed by heat spreader protrusion 56 as illustrated by arrow 212.

As shown in FIG. 10, substrate 14 is placed into contact with mold chase 52 so that die 12 and wires 16 fit within, and are protected by, protruding section 56 of heat spreader 50.

Molding compound 30 is made flowable, by heating for example, and is applied by injecting tubes (not shown), for example, over heat spreader 50 to completely fill the space 26 between heat spreader 50 and substrate 14 with die 12, and around dimples 54, and around dimples 55 protruding from outer surface 51 of protruding section 56 as at arrow 230. The flowable molding compound 30 also flows through gaps 53' (also see FIG. 6) as at arrow 208, and through through-holes 58 as at arrow 210, into the space 26' below heat spreader flanges 59 to completely fill lower space 26'. It is noted that no voids or gaps within molding compound 30 filled space 26' are formed.

As shown in FIG. 10 substrate 14 contacts outer ends 214 of mold chase 52 and the ends of dimples 54 at copper traces 116, and die 12 and wires 16 are embedded within flowable molding compound 30 in space 26. As necessary, solder paste may be added at the contact point between dimples 54 and copper traces 116 to further secure substrate 14 fixedly to heat spreader 50.

It is noted that flowable molding compound 30 does not need to be cured, thus providing for a faster cycling time.

As shown in FIG. 11, ball grid array 18 is then formed on bottom side 20 of substrate 14, and the structure of FIG. 12 is flipped over to form a die-up laminated embedded drop-in heat spreader ball grip array (MD-PBGA) package.

SUMMARY

The thermal performance can be significantly improved by integrating a low cost drop-in heat spreader 40, 50 in die-up laminated plastic ball grid array (PBGA) packages to form exposed drop-in heat spreader ball grid array (XD-PBGA) packages 10 or embedded drop-in heat spreader ball grid array (MD-PBGA) packages 11. The thermal performance of the XD-PBGA and MD-PBGA packages 10, 11, respectively, also remain comparable to that of enhanced ball grid array (EBGA) packages.

From the thermal results obtained, it was found that the thermal improvement of incorporating a copper drop-in heat spreader in the 27 X 27 272 PBGA packages fabricated in accordance with the present invention with: (1) 2-layer substrates was from about 20 to 22%; and (2) with 4-layer substrates was from about 13 to 15%.

In addition, the electrical performance of PBGA packages can be enhanced by incorporating a drop-in heat spreader in accordance with the present invention. This is due to the fact that the heat spreader 40, 50 can also serve as a common ground plane to reduce the drop-in heat spreader package noise, and further as a shield of electro magnetic interference (EMI).

Figure 14A:
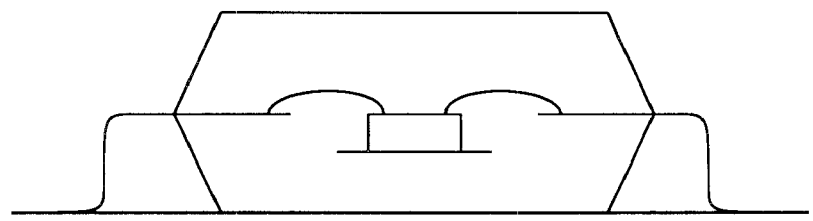
FIGS. 14A–14C schematically illustrate other technologies with which the drop-in heat spreader method of the present invention may be used.
Figure 14B:
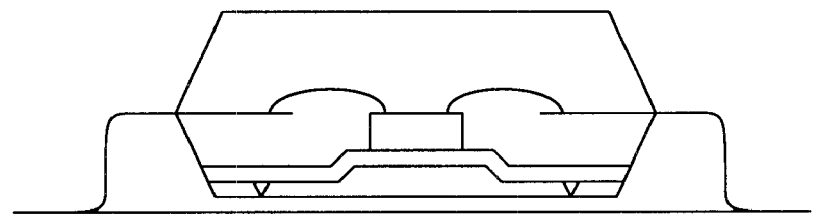
Figure 14C:
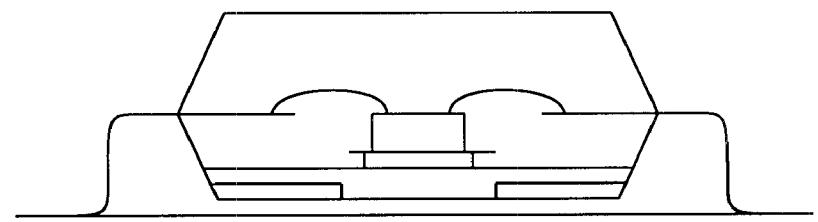

The present invention may be practiced in conjunction with, for example, the additional technologies illustrated in FIGS. 14A–14C. FIG. 14A illustrates a metric quad flat package (MQFP), FIG. 14B. illustrates a drop-in heat spreader QFP (DQFP), and FIG. 14C illustrates an exposed drop-in heat spreader QFP (EDQFP). These technologies illustrated in FIGS. 14A, 14B, 14C may be modified in accordance with the present invention.

Advantages of the Present Invention

The advantages of the XD-PBGA and MD-PBGA packages 10, 11, respectively, of the present invention include:
 i) low cost method of fabrication;
 ii) improvement of thermal performance;
 iii) enhancement of electrical performance; and
 iv) faster cycling time by not having to cure molding compound 30.

While particular embodiments of the present invention have been illustrated and described, it is not intended to limit the invention, except as defined by the following claims.

We claim:

1. A method of fabricating a die-up laminated PBGA package, including the steps of:
 providing a mold chase for a PBGA package; said mold chase having a bottom side, and an open side with an exposed bottom wall and side walls; said mold chase positioned open side up;
 dropping a heat spreader into said mold chase open side; said heat spreader having a lower protruding section, and lateral peripheral flanges with gaps therebetween; said protruding section contacting a portion of said bottom wall of said mold chase and said flanges contacting a portion of said exposed side walls of said mold chase to thereby secure said heat spreader within said mold chase;
 fixedly placing a substrate, having a die affixed thereto in a die down position, over said mold chase; said die positioned within said space above said protruding section; and
 applying a flowable molding compound within the space above said heat spreader and within the space below said heater spreader flanges to completely fill said spaces; said flowable molding compound also being flowable through said gaps.

2. The method of claim 1, wherein said heat spreader protruding section has an outer surface that is exposed in said die-up laminated PBGA package to form an exposed drop-in heat spreader ball grip array (XD-PBGA) package.

3. The method of claim 1, wherein said heat spreader protruding section has an outer surface that is embedded within said die-up laminated PBGA package to form an embedded drop-in heat spreader ball grip array (MD-PBGA) package.

4. The method of claim 1, wherein said heat spreader further includes at least one through-hole, whereby said flowable molding compound flows into said through-hole to increase adhesion of said heat spreader to said molding compound.

5. The method of claim 1, wherein said heat spreader further includes at least one through-hole, whereby said flowable molding compound flows through said through-hole to assist in filling said space below said heat spreader flanges, and further to increase adhesion of said heat spreader to said molding compound.

6. The method of claim 1, whereby said heat spreader further includes dimples contacting said substrate.

7. The method of claim 1, whereby said heat spreader further includes dimples contacting said substrate; said dimples having a height above said heat spreader of 0.2 $\mu$m.

8. The method of claim 1, whereby said heat spreader further includes dimples fixedly attached to said substrate.

9. The method of claim 1, further including the step of:
 forming a ball grip array on the exposed side of said substrate; after fixedly placing said substrate over said molding compound filled mold chase.

10. The method of claim 1, whereby said heat spreader serves as a common ground plane.

11. The method of claim 1, whereby said heat spreader serves as an electro magnetic interference (EMI) shield.

12. The method of claim 1, whereby said heat spreader further includes dimples contacting said exposed bottom wall of said mold chase to space said heat spreader from said exposed bottom wall of said mold chase and embed said heat spreader within said molding compound.

13. A method of fabricating a die-up laminated PBGA package, including the steps of:
 providing a mold chase for a PBGA package; said mold chase having a bottom side, and an open side with an exposed bottom wall and side walls; said mold chase positioned open side up;
 dropping a heat spreader into said mold chase open side; said heat spreader having a lower protruding section, and lateral peripheral flanges with gaps therebetween;

said protruding section contacting a portion of said bottom wall of said mold chase and said flanges contacting a portion of said exposed side walls of said mold chase to thereby secure said heat spreader within said mold chase;

fixedly placing a substrate, having a die affixed thereto in a die down position, over said mold chase; said die positioned within said space above said protruding section; and applying a flowable molding compound within the space above said heat spreader and within the space below said heater spreader flanges to completely fill said spaces; said flowable molding compound also being flowable through said gaps; said heat spreader further including at least one through-hole, whereby said flowable molding compound flows into said through-hole to increase adhesion of said heat spreader to said molding compound.

14. The method of claim 13, wherein said heat spreader protruding section has an outer surface that is exposed in said die-up laminated PBGA package to form an exposed drop-in heat spreader ball grip array (XD-PBGA) package.

15. The method of claim 13, wherein said heat spreader protruding section has an outer surface that is embedded within said die-up laminated PBGA package to form an embedded drop-in heat spreader ball grip array (MD-PBGA) package.

16. The method of claim 13, whereby said heat spreader further includes dimples contacting said substrate.

17. The method of claim 13, whereby said heat spreader further includes dimples contacting said substrate; said dimples having a height above said heat spreader of 0.2 $\mu$m.

18. The method of claim 13, whereby said heat spreader further includes dimples fixedly attached to said substrate.

19. The method of claim 13, further including the step of:

forming a ball grip array on the exposed side of said substrate; after fixedly placing said substrate over said molding compound filled mold chase.

20. The method of claim 13, whereby said heat spreader serves as a common ground plane.

21. The method of claim 13, whereby said heat spreader serves as an electro magnetic interference (EMI) shield.

22. The method of claim 13, whereby said heat spreader further includes dimples contacting said exposed bottom wall of said mold chase to space said heat spreader from said exposed bottom wall of said mold chase and embed said heat spreader within said molding compound.

23. A method of fabricating a die-up laminated PBGA package, including the steps of:

providing a mold chase for a PBGA package; said mold chase having a bottom side, and an open side with an exposed bottom wall and side walls; said mold chase positioned open side up;

dropping a heat spreader into said mold chase open side; said heat spreader having a lower protruding section, and lateral peripheral flanges with gaps therebetween; said protruding section contacting a portion of said bottom wall of said mold chase and said flanges contacting a portion of said exposed side walls of said mold chase to thereby secure said heat spreader within said mold chase;

fixedly placing a substrate, having a die affixed thereto in a die down position, over said mold chase; said die positioned within said space above said protruding section; said heat spreader further includes dimples contacting said substrate; and applying a flowable molding compound within the space above said heat spreader and within the space below said heater spreader flanges completely filling said spaces; said flowable molding compound also being flowable through said gaps; said heat spreader further includes at least one through-hole, whereby said flowable molding compound flows into said through-hole to increase adhesion of said heat spreader to said molding compound.

24. The method of claim 23, wherein said heat spreader protruding section has an outer surface that is exposed in said die-up laminated PBGA package to form an exposed drop-in heat spreader ball grip array (XD-PBGA) package.

25. The method of claim 23, wherein said heat spreader protruding section has an outer surface that is embedded within said die-up laminated PBGA package to form an embedded drop-in heat spreader ball grip array (MD-PBGA) package.

26. The method of claim 23, whereby said dimples having a height above said heat spreader of 0.2 $\mu$m.

27. The method of claim 23, whereby said dimples are fixedly attached to said substrate.

28. The method of claim 23, further including the step of:

forming a ball grip array on the exposed side of said substrate; after fixedly placing said substrate over said molding compound filled mold chase.

29. The method of claim 23, whereby said heat spreader serves as a common ground plane.

30. The method of claim 23, whereby said heat spreader serves as an electro magnetic interference (EMI) shield.

31. The method of claim 23, whereby said dimples contact said exposed bottom wall of said mold chase to space said heat spreader from said exposed bottom wall of said mold chase and embed said heat spreader within said molding compound.

* * * * *